(12) United States Patent
Satony et al.

(10) Patent No.: US 12,309,956 B2
(45) Date of Patent: May 20, 2025

(54) LINEAR GUIDE SYSTEM

(71) Applicant: Accuride International GmbH, Diez (DE)

(72) Inventors: Christian Satony, Urbar (DE); Christoph Neuhaus, Niederelbert (DE); Thomas Quirein, Diez (DE); Laurent Tremolieres, Limburg-Linter (DE)

(73) Assignee: Accuride International GmbH, Diez (DE)

( * ) Notice: Subject to any disclaimer, the term of this patent is extended or adjusted under 35 U.S.C. 154(b) by 143 days.

(21) Appl. No.: 18/308,782

(22) Filed: Apr. 28, 2023

(65) Prior Publication Data

US 2024/0081013 A1    Mar. 7, 2024

(30) Foreign Application Priority Data

May 2, 2022    (EP) .................................... 22171176

(51) Int. Cl.
*F16C 29/04*    (2006.01)
*A47B 88/493*    (2017.01)
*H05K 7/02*    (2006.01)

(52) U.S. Cl.
CPC ............ *H05K 7/02* (2013.01); *A47B 88/493* (2017.01); *F16C 29/048* (2013.01); *A47B 2210/007* (2013.01); *F16C 2314/72* (2013.01)

(58) Field of Classification Search
CPC ...... H05K 7/02; A47B 88/457; A47B 88/477; A47B 88/487; A47B 88/493; A47B 2210/007; F16C 29/046; F16C 29/048; F16C 2314/72
See application file for complete search history.

(56) References Cited

U.S. PATENT DOCUMENTS

| | | | | |
|---|---|---|---|---|
| 3,975,063 A | * | 8/1976 | Mahotka | A47B 88/493 |
| | | | | 384/18 |
| 2017/0149229 A1 | | 5/2017 | Li et al. | |
| 2023/0180931 A1 | * | 6/2023 | Xi | A47B 88/453 |
| | | | | 312/408 |

FOREIGN PATENT DOCUMENTS

EP    3919770 A1    12/2021

OTHER PUBLICATIONS

Search Report issued on Oct. 20, 2022, in corresponding European Application No. 22171176.5, 17 pages.

* cited by examiner

*Primary Examiner* — Phillip A Johnson
(74) *Attorney, Agent, or Firm* — Maier & Maier, PLLC

(57) ABSTRACT

A linear guide system having a first rail element, a second rail element, and a third element. The first rail element and the second rail element are borne such that the first rail element and the second rail element are linearly displaceable in relation to one another in and counter to an extraction direction, and the third element and the first rail element as well as the third element and the second rail element are borne together such that the third element and the first rail element as well as the third element and the second rail element are linearly displaceable in relation to one another in and counter to the extraction direction. The linear guide system in this case additionally includes an electrical conductor.

20 Claims, 6 Drawing Sheets

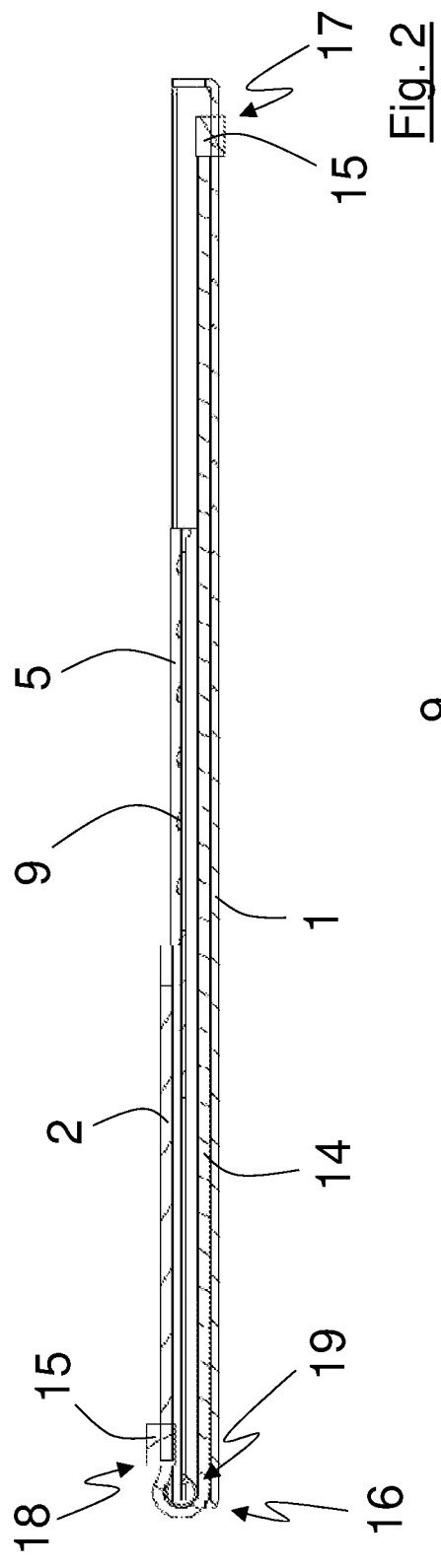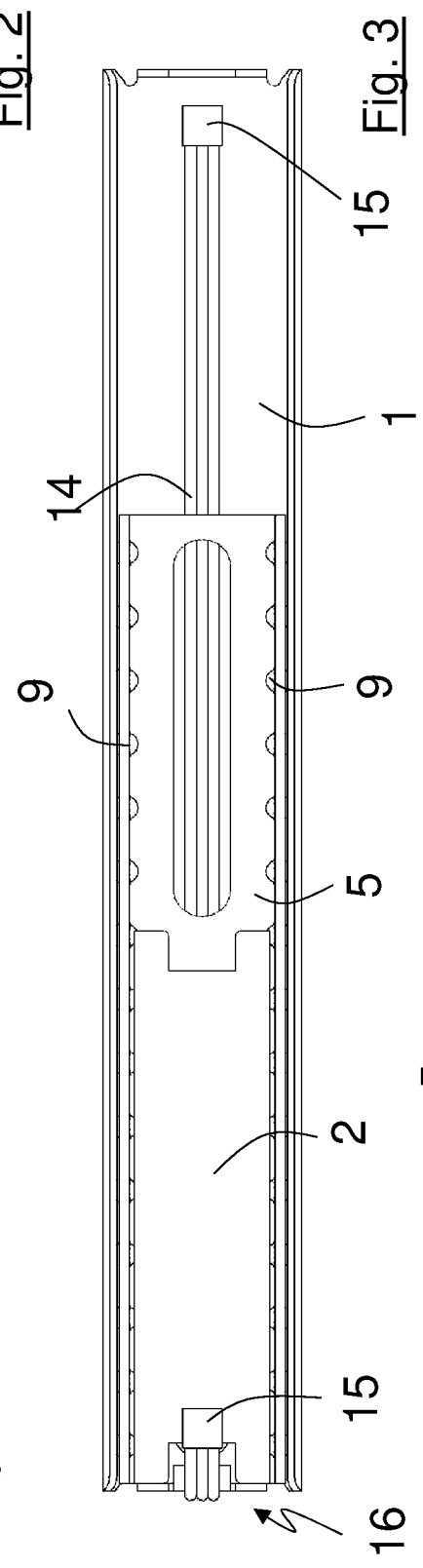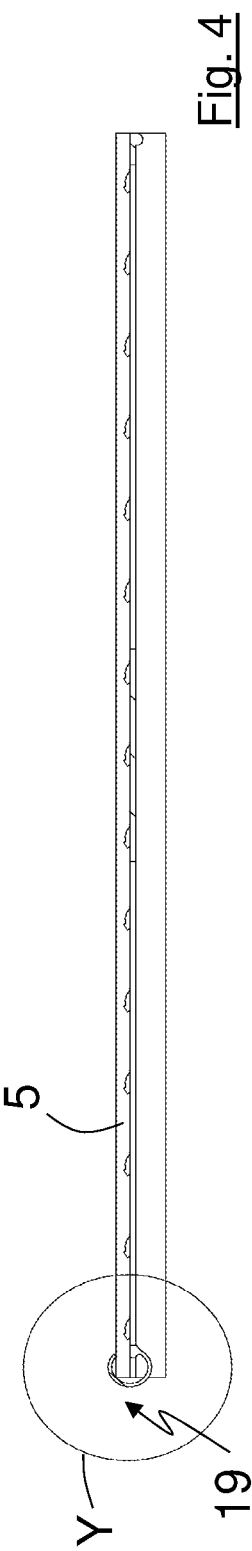

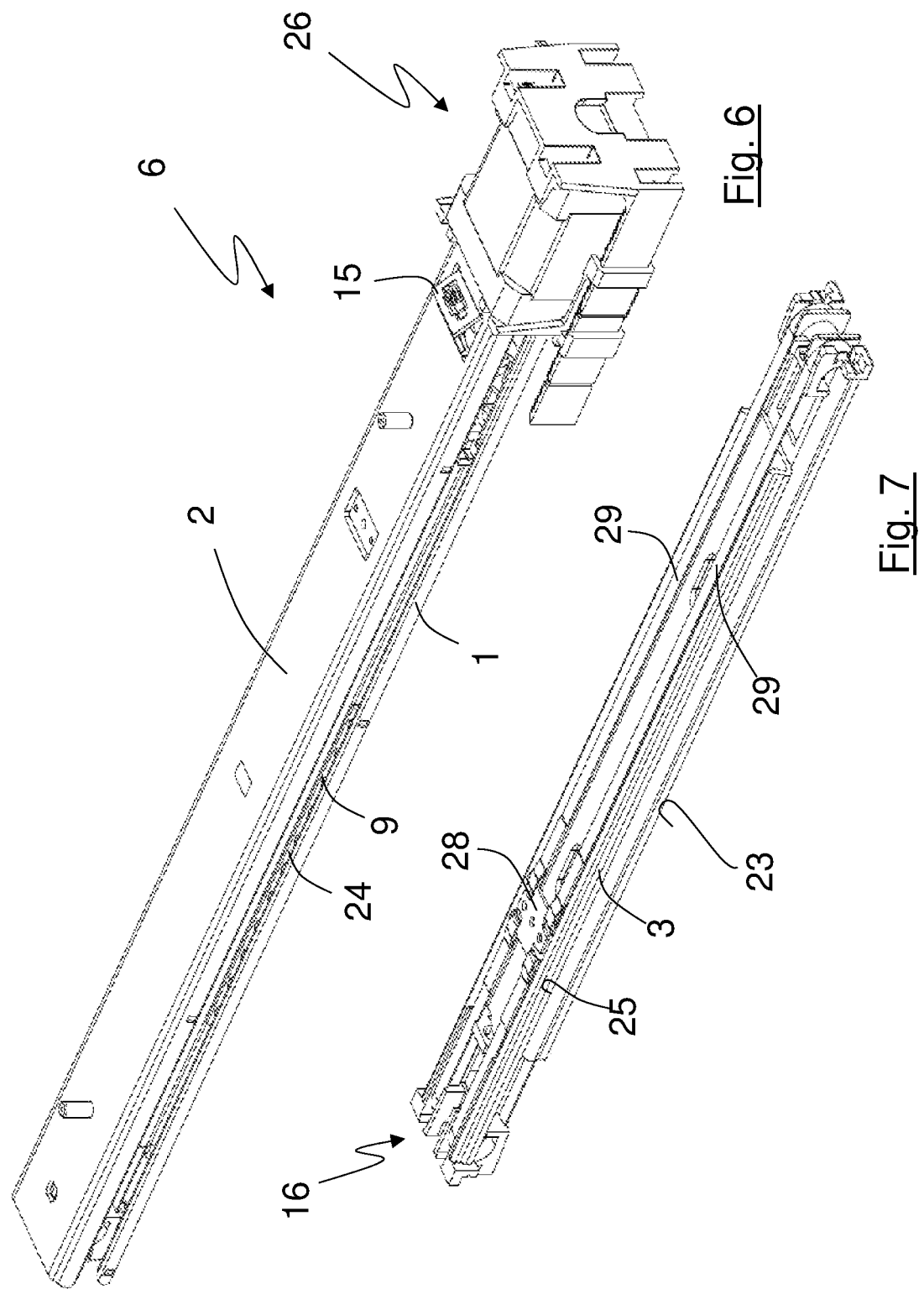

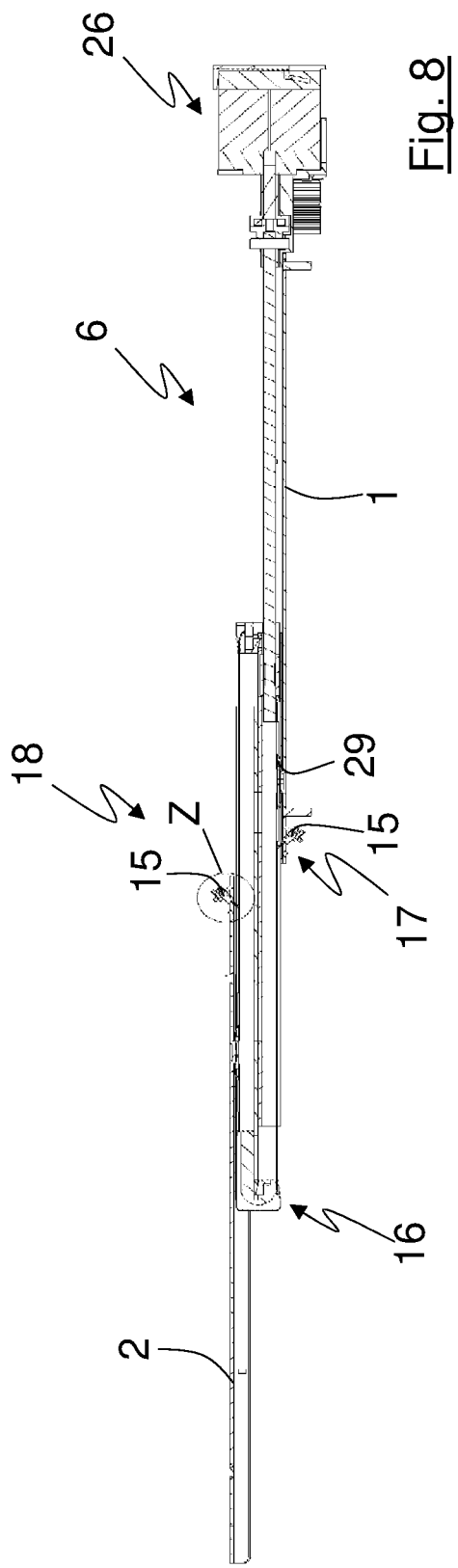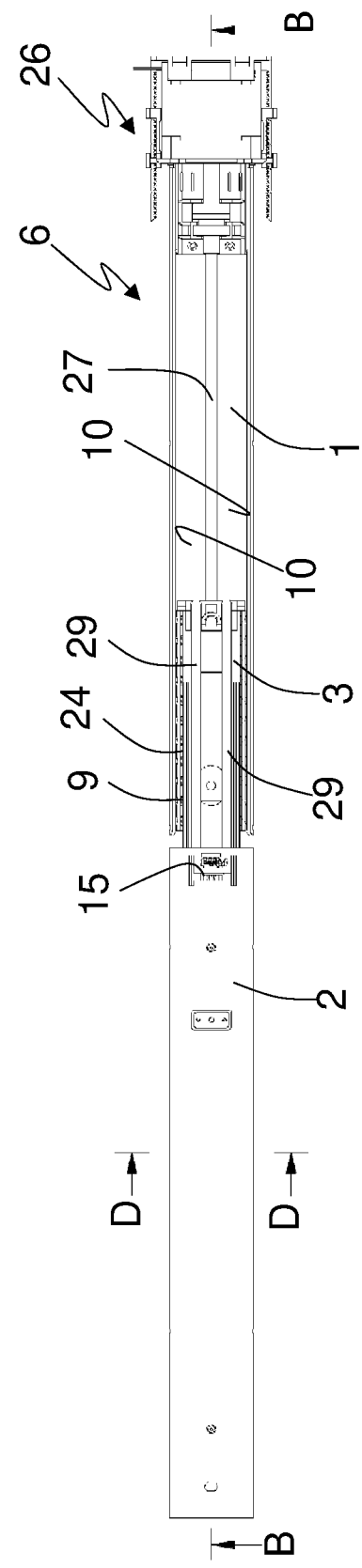

LINEAR GUIDE SYSTEM

FIELD

The present invention relates to a linear guide system having a first rail element, a second rail element, and a third element, the first rail element and the second rail element being borne such that the first rail element and the second rail element are linearly displaceable in relation to one another in and counter to an extraction direction, the third element and the first rail element as well as the third element and the second rail element being borne together such that the third element and the first rail element as well as the third element and the second rail element are linearly displaceable in relation to one another in and counter to the extraction direction.

BACKGROUND

Such linear guide systems, in particular in the form of extraction rails and linear guides, are known in varied embodiments from the prior art. They are used in various household appliances, but also in automotive manufacturing and in many other applications. A large number of applications already use motor-driven linear guide systems. Given the desire for a motorised drive, it is often the case that an electrical consumer or also a data network component is to be provided on the element moved in relation to a stationary element with the aid of the linear guide system. An example of an electrical consumer is a lighting system or an electrical socket. An example of a data network component is a LAN box or a router. In addition, current developments, such as Industry 4.0 and also the Internet of Things (IoT), which are completely independent of a motor drive of the rail mean that, in more and more applications, parts must be supplied with power and data with linearly displaceable elements. Appropriate conduits must be provided for this purpose.

Because the stationary element and the moved element can perform a relative movement in relation to one another by means of the linear guide system and can take a plurality of intermediate positions between two end positions, an electrical power supply or a cable-connected data link to the moved element presupposes an electrical conductor that is movable along with the moved element. One example can be a sliding drawer, in which case a bread cutting machine is arranged as an electrical consumer in the drawer. In the prior art, a cable with an overlength is then laid loosely between the stationary element, e.g., the cabinet body and the moved element. This carries the risk of the cable with the electrical conductor engaging in some way with the guide system during use of the linear guide system, thereby causing damage to either the cable or the guide system or both. Therefore, in the prior art, there are cable carriers and energy chains that reduce the risk of damaging the cable, because they guide the cable in a protected housing. However, cable carriers and energy chains have relatively large dimensions and thus reduce the available installation space.

By contrast, the problem addressed by the present invention is to provide a linear guide system that enables electrical power or signal transmission from a fixed element to an element that is linearly movable in relation thereto and avoids the disadvantages of the prior art.

SUMMARY

According to the present invention, this problem is solved by a linear guide system. For this purpose, the linear guide system of the aforementioned kind comprises an electrical conductor, the electrical conductor being fixed on the first rail element at a first point of fixation and on the second rail element at a second point of fixation, the electrical conductor being electrically insulated against at least the third element, and the electrical conductor being deflected at a point of deflection on the third element.

The present invention is based on the idea of providing a linear guide system with at least two rail elements borne so as to be linearly slidable in relation to one another, the electrical conductor being fixed for an electrical power or signal transmission on the first rail element and the second rail element, respectively, and deflected on a third element that is borne so as to be linearly slidable in relation to the first and second rail elements.

The arrangement according to the invention enables the electrical conductor to be accommodated in the internal space between the first and second rail elements or between the first rail element or the second rail element and the third element in a protected manner. The third element in this case provides the required guidance and/or tensioning of the electrical conductor such that it does not engage with the rail elements or the third element and there is no damage to the rail elements, the third element, or the electrical conductor.

The invention enables an electrical connection via a linear guide system to be provided in applications that previously had to be lavishly equipped with bulky cable carriers or energy chains. Examples of this include a fingerprint sensor integrated into a drawer handle that releases the drawer to the user while gripping the handle, and a LIDAR sensor on an extraction system for detecting objects in the travel path.

In one embodiment, the power and/or signal transmission is performed exclusively via the electrical conductor, and the first and second rail elements as well as the third element serve solely for the mechanical guidance of the electrical conductor.

In one embodiment of the invention, the electrical conductor is also electrically insulated against at least the first rail element or the second rail element, but preferably against the first rail element and the second rail element.

An electrical conductor in the context of the present invention is understood to mean an electrically conductive element, in particular a wire, a fibre, a filament, or a film. It is understood that such an electrical conductor is made of an electrically conductive material. Metal is particularly suitable for this purpose, but electrically conductive non-metallic materials such as graphite can also be considered. The latter often have the benefit of being well integratable. For example, graphite in the form of a fibre can be woven into a ribbon.

In one embodiment of the invention, the electrical conductor is a component of an electrical cable having an insulation and the electrical conductor or a plurality of electrical conductors. In one embodiment of the invention, the electrical conductor is a component of a flat ribbon cable. Flat ribbon cables have the advantage that, given the appropriate guidance and deflection, the deflection radius for all electrical conductors inside the flat ribbon cable is approximately equal in size. In one embodiment of the invention, the linear guide system comprises a plurality of electrical conductors. The plurality of electrical conductors can in this case be gathered together in a single cable.

If the electrical conductor is a component of a flat ribbon cable, the flat ribbon cable can be oriented either parallel or perpendicular to a rail back of the first or the second rail element.

When it is described in the present application that the electrical conductor is in contact with a further element, in particular in contact with the third element or a deflection element of the third element, this includes an indirect contact in which the insulation of a cable surrounding the electrical conductor is in contact with the further element.

In particular, the electrical conductor represents an electrically conductive connection between the fixed rail element and the movable rail element.

The deflection according to the invention is particularly advantageous when the electrical conductor is deflected at the point of deflection of the third element such that a total travel length of the electrical conductor is substantially constant, independently of the extraction position of the first rail element in relation on the second rail element. In this context, the overall travel length of the electrical conductor is not considered to be its length as such (this would be constant independently of how the electrical conductor is guided and deflected in the linear guide system), but rather the length of the path over which the electrical conductor is guided in the linear guide system. The total travel length of the electrical conductor in the context of the present application is formed from a first partial travel length between the first point of fixation on the first rail element and the point of deflection on the third element and from a second travel length between the second point of fixation on the second rail element and the point of deflection on the third element.

The constancy of this total travel length of the electrical conductor, independently of the extraction position of the first rail element in relation on the second rail element, is in particular ensured when the third element and the first rail element, as well as the third element and the second rail element, are linearly slidable in relation to one another such that a displacement of the first rail element in relation on the second rail element by a first displacement distance results in a displacement of the third element in relation to the first rail element by a second displacement distance, in which case the second displacement distance is equal to half of the first displacement distance.

For the third element in the context of the present application, there are several possible implementations.

In one embodiment of the invention the third element is a rolling body cage arranged between the first rail element and the second rail element, a plurality of rolling bodies being received on the rolling body cage, and each of the plurality of rolling bodies being rolled on a running surface of the first rail element and on a running surface of the second rail element. In other words, each of the plurality of rolling bodies rolls between a running surface of the first rail element and a rolling surface of the second rail element. Such a rolling body cage between the first rail element and the second rail element moves by a second displacement distance in relation to the first rail element between the running surfaces of the two rail elements due to the rolling movement of the rolling bodies accommodated therein when the first rail element is moved in relation on the second rail element by a first displacement distance. The second displacement distance is then about half of the first displacement distance. In this way, the electrical conductor deflected on the rolling body cage is always guided with a constant overall travel length.

Such an embodiment of the linear guide system, in which the third element is a rolling body cage, is particularly suitable for an extraction rail that forms a partial extraction with only two rail elements, or for a linear guide with only two rail elements.

However, such a variant can also be used in order to implement an extraction rail that forms a full extraction or an over-extraction. Then, between the first and the second rail elements, a third rail element is provided. The third rail element is also referred to as a centre rail (it is arranged between the first and second rail elements).

The bearing of the first rail element on the third rail element is performed via a plurality of rolling bodies arranged in a first rolling body cage, and the bearing of the second rail element on the third rail element is also performed via a plurality of rolling bodies received on a second rolling body cage. The first and second rolling body cages then each deflect a respective electrical conductor. The first electrical conductor is fixed on the first rail element and the third rail element and is deflected by the first rolling body cage. The second electrical conductor is fixed on the third rail element and the second rail element and is deflected by the second rolling body cage. In such an embodiment, the first and the second rolling body cage also form the third element with the deflection of the electrical conductor in the context of the present application.

In one embodiment of the invention, the linear guide system is an extraction rail and the third element used for deflection of the electrical conductor is a third rail element. The second rail element is thus displaceably borne on the first rail element, and the third rail element is displaceably borne on the second rail element. Such an embodiment in particular enables the configuration of a full extraction or an over-extraction.

In principle, it is possible to implement an extraction rail according to the invention with the first, second, and third rail elements, with two rail elements forming a respective sliding guide together as long as the movement of the three rail elements occurs in a synchronised manner. Such a synchronisation of the extraction movement of the rail elements can be brought about, as explained in detail below, by an additional traction member, which is fixed on the first and second rail elements and deflected at a first and a second end of the third rail element. Alternatively, the synchronisation can be brought about by the electrical conductor or cable, which is fixed on the first and the second rail elements and deflected at a first end of the third rail element, as well as additional by a traction member fixed on the first and the second rail element and deflected at the second end of the third rail element.

However, in one embodiment, the first, second, and third rail elements of the extraction rail are guided towards one another in pairs with a respective rolling body bearing. However, regardless of the fact that the first, second, and third rail elements are connected to one another via a rolling body bearing, in such an embodiment, the third rail element serves as the third element in the context of the present application rather than the rolling body cages for deflecting the electrical conductor. It is understood that the synchronisation outlined above must be implemented, even in such an embodiment.

It is also possible to provide a rolling body bearing between a first pair of rail elements and a slide bearing between a second pair of rail elements of the same extraction rail.

In one embodiment of the invention, the third element comprises a deflection element at the point of deflection, independently of whether the third element is formed by a ball cage or by a third rail element. The electrical conductor is in contact with the deflection element and is deflected by the deflection element. In this case, the deflection on the third element or on the deflection element of the third element occurs such that the electrical conductor runs substantially parallel to the extraction direction after the deflection, the deflection deflecting the electrical conductor by about 180°.

In one embodiment of the invention, the deflection element is selected from a group consisting of a convexly curved sliding surface, a plurality of sliding surface portions arranged in a circumferential direction with at least one recess between two sliding surface portions, and a pivotable deflection roller or combination thereof.

Regarding the deflection, it must be considered that this is done dynamically. The portion of the electrical conductor or insulation surrounding the electrical conductor that is in contact with the deflection element (the contact between the electrical conductor and the deflection element is then indirect) changes continuously during an extraction or insertion movement. Thus, the deflection element must be either pivotally or rotatably borne, or it must be possible for the electrical conductor or its insulation to slide in relation to the deflection element.

Due to the described dynamics of the deflection, but also in order to enable easier assembly, in one embodiment of the invention, the third element comprises a deflection element, in which case the deflection element can be positioned in relation to a base body of the third element at least at a first tensioning position and at a second tensioning position in the extraction direction. Such a variant enables the electrical conductor and, if necessary, its insulation to be tightened or tensioned.

The positioning capability of the deflection element in relation to the base body of the third element can in this case be designed to be discrete. That is to say, during assembly, the position of the deflection element is determined in relation to the base body. In such an embodiment, whether the deflection element is arranged in relation to the base body in the first tensioning position or the second tensioning position depends, for example, on the specifically mounted cable length or other manufacturing tolerances.

However, a discrete tightening or tensioning of the electrical conductor or cable can also be realised such that the first point of fixation on the first rail element or the second point of fixation on the second rail element can be selected at discrete positions of the respective rail element.

However, in one embodiment of the invention, the deflection element is resiliently biased in the extraction direction or is resiliently borne on the base body of the third element, so that the deflection element resiliently tensions the electrical conductor. It is understood that even in such an embodiment, the deflection element can be positioned in relation to the base body in at least two tensioning positions, but in particular over a continuous tensioning path, depending on the length of the electrical conductor or cable.

Such a resiliently biasing of the deflection element in relation to the base body of the third element can be realised, for example, by providing a spring, for example a spiral spring, between the deflection element and the base body which biases the deflection element in or counter to the extraction direction.

However, a resiliently biased deflection element can also be designed to be integral with the base body. For example, if the third element is a rolling body cage, the deflection element can be punched out of a sheet of the rolling body cage as a tab and bent to the deflection element with a convexly curved sliding surface. Such a curved deflection element made of sheet metal can be designed in a resilient manner, per se, such that its sliding surface tensions the electrical conductor. Alternatively, the rolling body cage can be made integrally from plastic, for example by injection moulding.

In one embodiment of the invention, however, a cable tensioner can also be provided on the first rail element or on the second rail element or on the third element, in which case the cable tensioner resiliently tensions the electrical conductor or cable in a direction perpendicular to the extraction direction.

In an alternative embodiment, it is possible to resiliently bias the first point of fixation on the first rail element or the second point of fixation on the second rail element in the extraction direction. In this way, a tensioning of the electrical conductor or the cable can also be achieved.

In one embodiment of the invention, precise manufacturing of the length of the electrical conductor in relation to the total travel length of the electrical conductor is performed such that the electrical conductor only has a reasonable amount of play in relation to the deflection element after assembly.

In one embodiment of the invention, the linear guide system comprises an electrical connection element, a first end of the electrical conductor being manufactured with the connection element. One example of such an electrical connection element is a plug or socket for contacting the electrical conductor with a connection element that is complementary thereto.

In one embodiment of the invention, the connection element is fastened to the first or second rail element. Such a fastening of the coupler to the first or second rail element enables the provision of a "plug-and-play" system. The user of the linear guide system mechanically mounts it and electrically contacts the connection elements.

There are a variety of options for fastening the electrical connection element to the respective rail element. In one embodiment of the invention, the connection element is materially bonded to the respective rail element, for example by gluing or welding, or is connected in a form-fit manner to the respective rail element. An embodiment of the electrical connection element comprising one or more catching tabs is in particular suitable for a form-fit connection, in which case the connection element is inserted into a perforation in the respective rail element, preferably in the rail back of the rail element, and is latched with the aid of the catch tabs. In one embodiment of the invention, the connection element has a recess in the form of an indentation or a perforation, in which case the connection element is stuck onto a tab punched and bent out of the rail element, preferably out of the rail back of the rail element.

It is understood that, in one embodiment of the invention, each end of the electrical conductor is respectively manufactured with at least one connection element. The connection element on the first end of the electrical conductor is in this case fixed on the first rail element, and the connection element on the second end of the electrical conductor fixed on the second rail element.

In one embodiment, the connection element is designed so as to fix the electrical conductor on the first rail element or the second rail element. In one such embodiment, the connection element is not only mounted on the rail element, but also serves to fix the electrical conductor on the rail element. The connection element is then also used in order to introduce traction forces acting on the electrical conductor into the respective rail element.

An electrical conductor deflected on the third rail element also results in a synchronisation of the extraction movement of the second rail element in relation to the third rail element when the third rail element is moved in relation to the first rail element.

In one embodiment of the invention, the linear guide system is an extraction rail, the third element being a third rail element. In such an embodiment, it can be preferable if the third rail element comprises a deflector member at the point of deflection, in which case the electrical conductor is in contact with the deflection element and is deflected by the deflection element, the extraction rail comprising a traction member, the traction member being fixed on the first rail element and on the third rail element, and the traction member being guided on the deflection element in a direction parallel to the extraction direction such that a sliding movement of the third rail element in relation to the first rail element results in a sliding movement of the second rail element in relation to the third rail element.

Thus, in one embodiment of the invention, the electrical conductor is integrated into a preferably ribbon-shaped traction member. In one embodiment, the electrical conductor is woven into the traction member. Such a traction member, for example made of a plastic material, has a high traction strength and can therefore provide the required strength for a synchronisation function, which the electrical conductor could possibly not guarantee alone.

In an alternative embodiment, the traction member and the electrical conductor, in particular the electrical conductor in a cable, are designed as separate elements. In one such embodiment, it is preferable if the deflection element comprises a first deflection surface and a second deflection surface, in which case the first deflection surface is in contact with and deflects the traction member and the second deflection surface is in contact with and deflects the electrical conductor. In one such embodiment, the traction member is used for mechanical synchronisation, while the electrical conductor or cable is guided with lower tensioning and is only used for electrical power or signal transmission. The combination of the electrical conductor with the additional, separated traction member or the integration of the electrical conductor into the traction member can take on high forces from the traction member, for example, when accelerating or retarding the rail elements, and prevent the electrical conductor from suffering damage.

In one embodiment of the invention, the linear guide system comprises a drive means, for example, a spindle drive having an electric motor, in which case the drive means is borne on the first rail element or can be borne on a retaining element connectable to the first rail element, the drive means being designed such that, during operation of the extraction rail, the drive means causes a linear movement of the third rail element in relation to the first rail element in or counter to the extraction direction.

In one embodiment of the invention, the guide system is selected from a group consisting of an extraction rail (often referred to as a telescopic rail), and a linear guide. In this case, the linear guide system described in the preamble comprises sliding guides as well as rolling body guides, in particular ball guides or roller guides.

A linear guide in the context of the present application is understood to mean a linear guide system in which one of the first or second rail elements is significantly shorter than the other rail element. It is understood that an embodiment of the linear guide system in which the third element is a rolling body cage is particularly suitable for implementing a linear guide in which the first or second rail element is significantly shorter than the other rail element.

In the context of the present application, the extraction direction is understood to be the direction in which the first rail element and the second rail element can be moved in relation to one another, preferably linearly, in order to move from a retraction position into an extraction position. Accordingly, a direction counter to the extraction direction is the direction in which the first and second rail elements are moved in relation to one another in order to return to the retraction position. In an extraction rail, the retraction position is the position of the first and the second rail elements in relation to one another, in which the extraction rail is fully retracted. The extraction position then refers to the position of the first and the second rail element in relation to one another in which the extraction guide is maximally extracted. In a linear guide, the retraction position and the extraction position refer to the two end positions of the short rail element in relation to the long rail element.

When in the present application it is stated that the linear guide system according to the invention comprises a first rail element and a second rail element, this does not rule out that the linear guide system, in particular if it is an extraction rail, comprises further rail elements, in particular a total of three rail elements.

In one embodiment of the invention, the first and second rail elements each comprise two running surfaces, in which case rolling bodies received in a rolling body cage are arranged on the running surfaces of the first rail element and on the running surfaces of the second rail element. These rolling bodies roll on the respective running surfaces and reduce a friction between the first rail element and the second rail element. If the first rail element and the second rail element are directly connected to one another, the rolling bodies roll on a respective running surface of the first rail element and the second rail element. In one embodiment in which a third rail element is arranged between the first rail element and the second rail element, rolling bodies respectively roll on a running surface of the first rail element and a running surface of the third rail element or on a running surface of the second rail element and a running surface of the third rail element.

A rolling body in the context of the present application is understood to be a rotating body which, as an element of a guide, significantly reduces the friction between the various rail elements and thus facilitates a relative movement of two rail elements in relation to one another. Examples of rolling bodies include balls, rollers, barrels, needles, or cones. In one embodiment of the present invention, the rolling bodies are balls. It is understood that the rolling body cage in this case is a ball cage. In one embodiment of the invention, at least the ball cage is made of a material selected from a group consisting of sheet steel, aluminised sheet steel, stainless steel, and plastic.

In one embodiment of the invention, at least the first rail element or the second rail element is made of a material selected from a group consisting of sheet steel, aluminised sheet steel, stainless steel, and plastic.

In one embodiment of the invention, at least the first rail element, the second rail element, or the third rail element comprise a rail back and running surfaces connected thereto by way of the rail back, in which case the running surfaces face towards or away from one another, depending on the arrangement. The cross-sectional profile of such a rail element is substantially C-shaped.

In such an embodiment, the electrical conductor is protected between the two rail backs of two abutting rail elements, i.e. accommodated either between the first and second rail elements or between the first rail element and the third rail element or between the second rail element and the third rail element.

BRIEF DESCRIPTION OF THE FIGURES

Further advantages, features, and possible applications of the present invention will become apparent from the following specification of embodiments thereof and the associated drawings. In the figures, like elements are identified using like reference signs.

FIG. 2 is a cross-sectional view through the linear guide system of FIG. 1.

FIG. 3 is a top plan view of the linear guide system of FIGS. 1 and 2.

FIG. 4 is a lateral view of the ball cage of the linear guide system from FIGS. 1 to 3.

FIG. 6 is an isometric view of an extraction rail as a second embodiment of a linear guide system according to the present invention.

FIG. 7 is an isometric view of the third rail element of the linear guide system of FIG. 6.

FIG. 8 is a lateral sectional view in the longitudinal direction through the linear guide system of FIG. 6.

FIG. 9 is a top plan view of the linear guide system of FIGS. 6 to 8.

DETAILED DESCRIPTION

Figure 1:
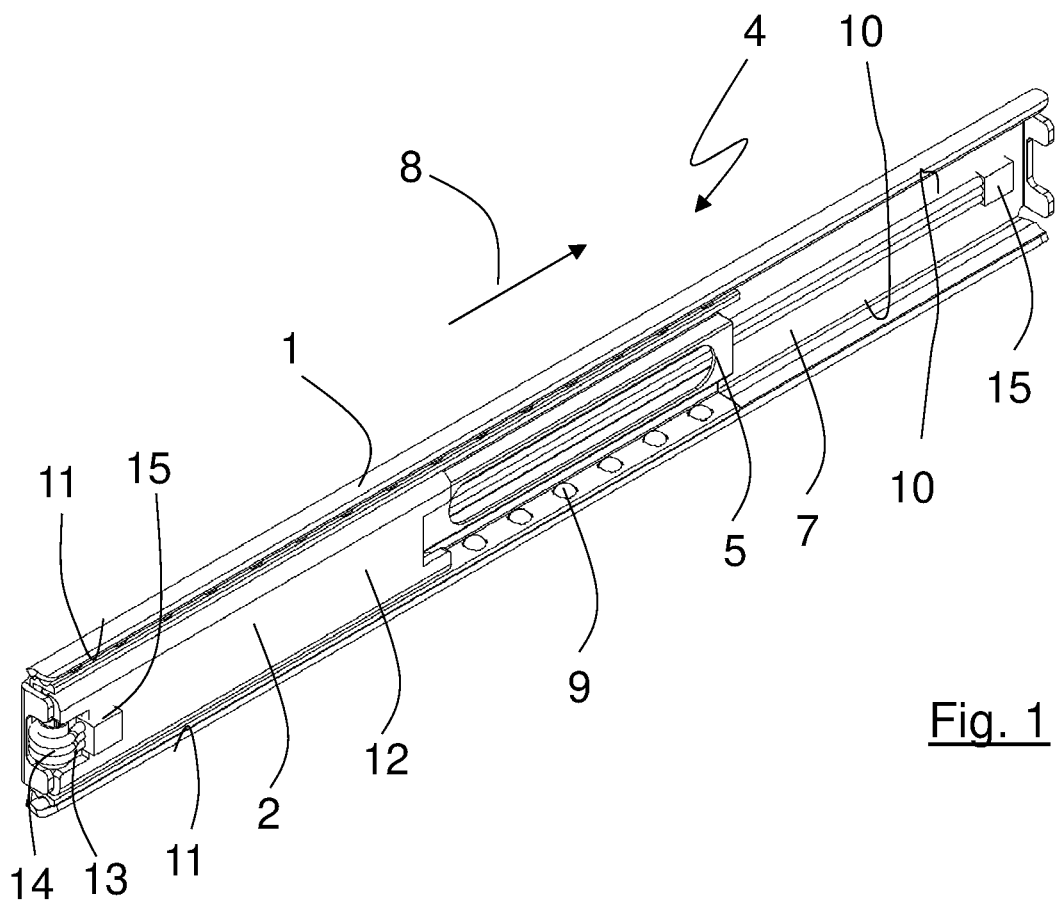
FIG. 1 is an isometric view of a linear guide as a first embodiment of a linear guide system according to the present invention.
Figure 5:
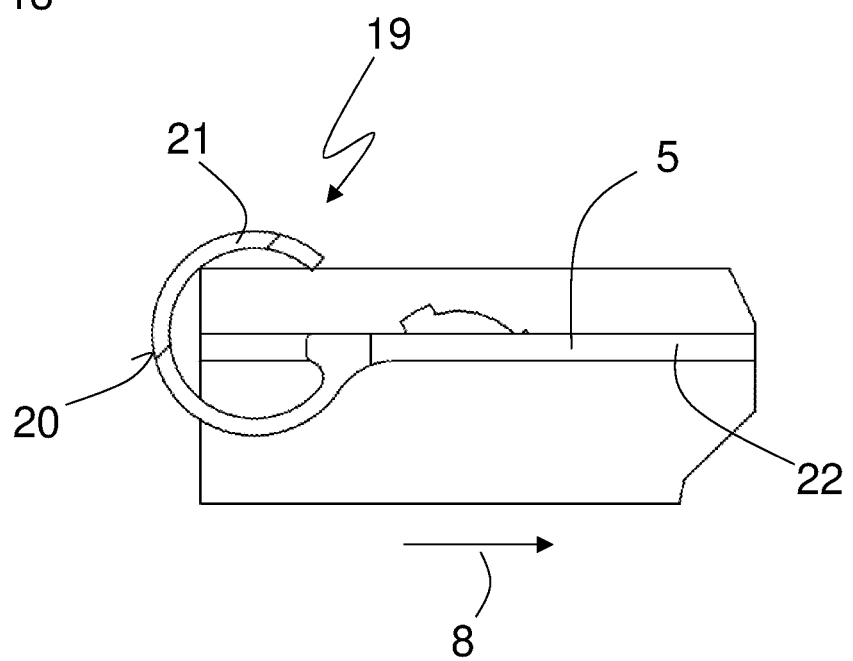
FIG. 5 is an enlarged view of the area of the ball cage labelled Y in FIG. 4.

The embodiment of the linear guide system according to FIGS. 1 to 5 is formed by a linear guide 4. The linear guide 4 comprises a first rail element 1, a second rail element 2, and a third element. The third element is formed by a ball cage 5 in the case of the linear guide 4 shown. It is characteristic for a linear guide that the first rail element 1 is significantly longer than the second rail element 2. The maximum travel path of the second rail element 2 in relation to the first rail element 1 is limited to the length of the first rail element 1 minus the length of the second rail element 2. The ball cage 5 is about double the length of the second rail element 2 and about two thirds the length of the first rail element.

The second rail element 2 is slidably borne on the first rail element 1 in and counter to an extraction direction 8 in relation thereto. For this purpose, the linear guide 4 comprises a ball bearing, which comprises the ball cage 5 and a plurality of rolling bodies accommodated thereon in the form of balls 9. The balls 9 roll on running surfaces 10 of the first rail element 1 and running surfaces 11 of the second rail element 2 and roll between the running surfaces 10, 11 of the first and second rail elements 1, 2. The running surfaces 10 of the first rail element 1 are connected to one another by a rail back 7. The running surfaces 11 of the second rail element 2 are connected to one another by a rail back 12.

The idea of the linear guide 4 according to the invention is now, in addition to a linear movement of an element connected on the second rail element 2 in relation to a stationary element connected to the first rail element, to enable a power supply or signal transmission from the stationary first rail element 1 on the second rail element 2. For this purpose, the linear guide 4 comprises a plurality of electrical conductors 13 in a flat ribbon cable 14. The cable 14, and with it the electrical conductors 13, are connected at their ends to a respective plug 15 as an electrical connection element in the context of the present application. The plugs 15 enable a simple electrical contacting of the electrical conductors 13 on both the first rail element 1 and the second rail element 2. For example, the plug 15 on the first rail element can be connected to a power supply and the plug 15 on the second rail element can be connected to a consumer. However, the transmission of information or data is also quite possible via the electrical conductors 13 of the flat ribbon cable 14 between the plugs 15.

The guidance of cable 14 and thus the function of the linear guide system according to the invention is now best discernible from the illustrations of FIGS. 2 to 5. In the sectional view of the linear guide 4 in FIG. 1, the entire path of the cable 14 between the plug 15 on the first rail element 1 and the plug 15 on the second rail element 2 can be seen. The ribbon cable runs substantially parallel to the rail back 7, 12 of the two rail elements 1, 2.

The ribbon cable 14 is deflected at a point of deflection 16 on the ball cage 5. Furthermore, the flat ribbon cable 14 is fixed with the aid of the plugs 15 at a first point of fixation 17 on the first rail element 1 and with the plug 15 at a second point of fixation 18 on the second rail element 2. The length of the flat ribbon cable is sized so as to bridge the distance from the first plug 15 on the first rail element 1 and the point of deflection 16 on the ball cage 5 and from the point of deflection 16 on the second plug 15 on the second rail element 2. The sum of the partial travel length from the first plug 15 on the first rail element 1 up to the point of deflection 16 and the second partial travel length from the point of deflection 16 on the second plug 15 on the second rail element 2 is the total travel length of the electrical conductor 13 or cable 14 in the context of the present application. This overall travel length is constant over all operating conditions, i.e., travel positions of the second rail element 2 in relation to the first rail element 1.

If the second rail element 2 is displaced to the right, for example from the end position shown in FIGS. 1 to 3, the first partial travel length and the second partial travel length change in equal measure, but with different signs. Referring to the example of FIGS. 1 to 3, this means that the first partial travel length is shortened and the second partial travel length is extended. This is possible because, when the second rail element 2 moves in relation to the first rail element 1 by a first displacement distance, the ball cage 5 is moved in relation to the first rail element 1 by a second displacement distance equal to half of the first displacement distance.

For the deflection, the ball cage 5 comprises a deflection element 19 at the point of deflection 16. The deflection element 19 is well discernible in the cross-sectional views from FIGS. 2 and 4 and is also shown enlarged in the broken-away view of FIG. 5. In the illustrated embodiment, the deflection element 19 comprises a convexly curved sliding surface 20. On this sliding surface 20, the flat ribbon cable 14 slides in relation to the first rail element 1 during a sliding movement of the second rail element 2 and thus the ball cage 5.

The deflection element 19 consists of a curvilinear tab 21, which supports the convexly curved sliding surface 20. With this configuration of the deflection element 19, the deflection element 19 forms a spring, i.e. the sliding surface 20 can be arranged at different positions of the extraction direction 8 in relation to the rest of the ball cage 5, which is referred to as the "base body" 22 of the ball cage 5 in the context of the present application. Due to this design, the sliding surface 20 can not only take a first and a second tensioning position in relation to the base body 22, but is continuously movable within its geometrical boundaries contrary to the spring force provided by the tab 21. In this way, the deflection element 19 provides a cable tensioner for the cable 14 and keeps the cable 14 tightly tensioned over the entire travel path of the second rail element 2 in relation to the first rail element 1. This serves to compensate for tolerances and effectively prevents the cable 14 from colliding in any way with the travel path of the second rail element 2 or the ball cage 5 in relation to the first rail element 1.

In the illustrated embodiment, the ball cage 5 is made of plastic by injection moulding. In this way, the implementation of complex forms of the deflection element 19 is also possible. Alternatively, the ball cage can be made of steel sheet metal by punching and bending. The tab 5 with the sliding surface 19 is then punched out of the sheet and bent so that it achieves the shape shown.

FIGS. 6 to 13 show an alternative embodiment of the linear guide system. In this embodiment, the linear guide system is an extraction rail 6. The extraction rail 6 forms a full extraction, i.e. the second rail element 2 can be moved over its entire length in relation to and out of the first rail element 1. For this purpose, the extraction guide 6 comprises a third rail element 3. In the embodiment of FIGS. 6 to 13, this third rail element 3 forms the third element in the context of the present application.

In this embodiment, the third rail element 3 also serves to deflect the flat ribbon cable 14. The third rail element 3 is borne on the first rail element 1 via a first pair of running surfaces 23 with the aid of bearing balls 9 arranged in a ball cage 24. The bearing balls, on the other hand, roll on the running surfaces 10 of the first rail element 1. The second rail element 2, in turn, is slidably borne on the third rail element 3 via a corresponding ball bearing with bearing balls 9 and a rolling body cage. For this purpose, the third rail element 3 comprises a second pair of running surfaces 25.

Due to the ball bearing of the third rail element 3 on the first rail element 1 and of the second rail element 2 on the third rail element 3, the second travel path of the third rail element 3 in relation to the first rail element 1 is, for a first travel path of the second rail element in relation to the first rail element 1, approximately equal to half of the first travel path. Therefore, in the embodiment of FIGS. 6 to 13, a deflection of the flat ribbon cable 14 holds the total travel length of the flat ribbon cable 14 from the first plug 15 on the first rail element 1 (first point of fixation 17 of the cable 14) to the point of deflection 16 on the third rail element 3 and from the point of deflection 16 to the plug 15 on the second rail element 2 (second point of fixation 18 of the cable 14) substantially constant. In this embodiment, the same concept can thus be realised for the deflection of the flat ribbon cable as in the deflection on the ball cage 5 according to the first embodiment from FIGS. 1 to 5.

The extraction rail 6 from FIGS. 6 to 13 is a motor-driven rail. Thus, it comprises an electric motor 26 flanged to the first rail element 1. This electric motor 26 drives a spindle drive with a threaded spindle 27 that is fixed on the third rail element 3 with a threaded nut. A rotation of the threaded spindle 27 causes a movement of the third rail element 3 in relation to the first rail element 1. At the same time, an extraction movement or retraction movement of the second rail element 2 in relation to the third rail element 3 is synchronised with the aid of a pair of traction members 29. Each of these traction members 29 is fixed via a first assembly plate 28 on the second rail element 2 on the one hand and via a second assembly plate 33 on the first rail element 1 on the other hand. The traction members 29 are deflected at both ends of the third rail element 3. In this way, a relative movement of the third rail element 1 in relation to the first rail element 1 is implemented in a synchronous relative movement of the second rail element 2 in relation to the third rail element 3.

Figure 10:
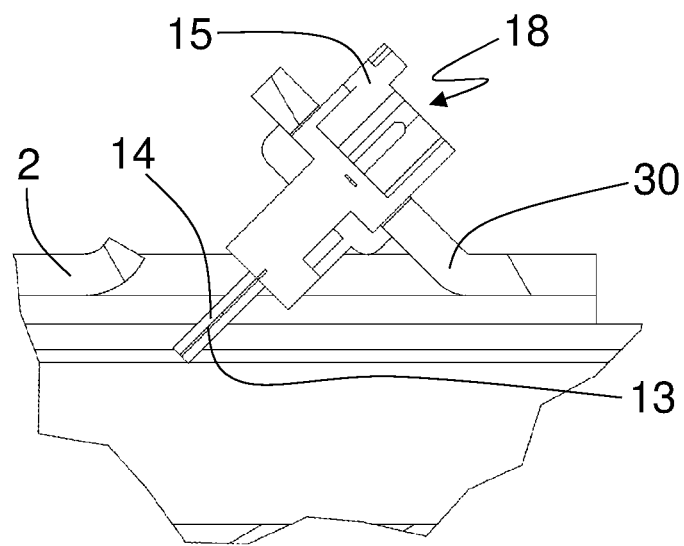
FIG. 10 is an enlarged view of the area labelled Z in FIG. 8.
Figure 11:
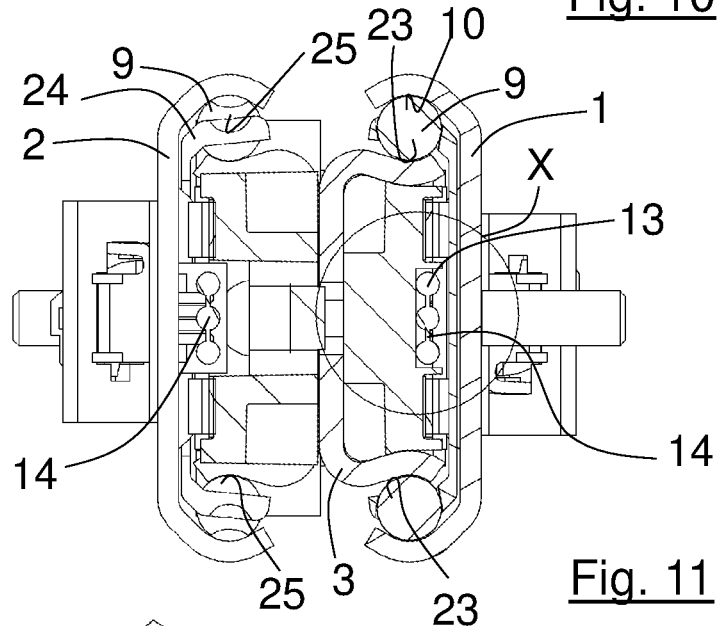
FIG. 11 is a sectional view of the linear guide system from FIGS. 6 to 11 along line D-D from FIG. 9.
Figure 12:
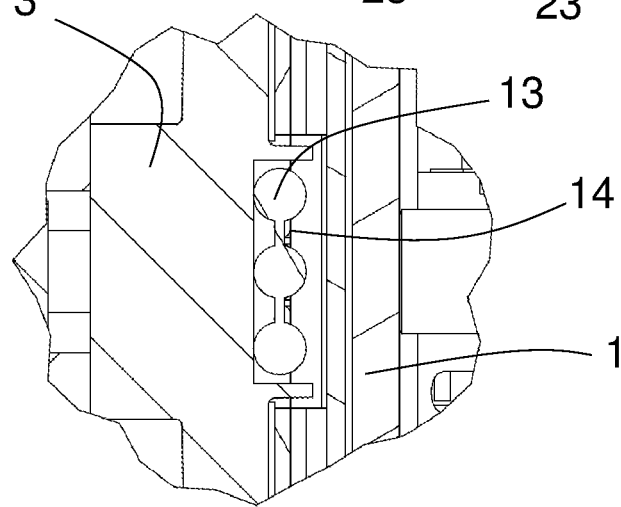
FIG. 12 is a broken-away, enlarged view of the area labelled X in FIG. 11.

FIG. 10 shows the plug 15 on the second rail element 2. This plug 15 simultaneously serves to fix the flat ribbon cable 14 and thus the electrical conductor 13 in the flat ribbon cable 14 at the second point of fixation 18 on the second rail element 2. For this purpose, the plug 15 has a perforation through which a tab 30 is punched out of the rail back 7 of the second rail element 2 and bent off of the rail back 7.

Figure 13:
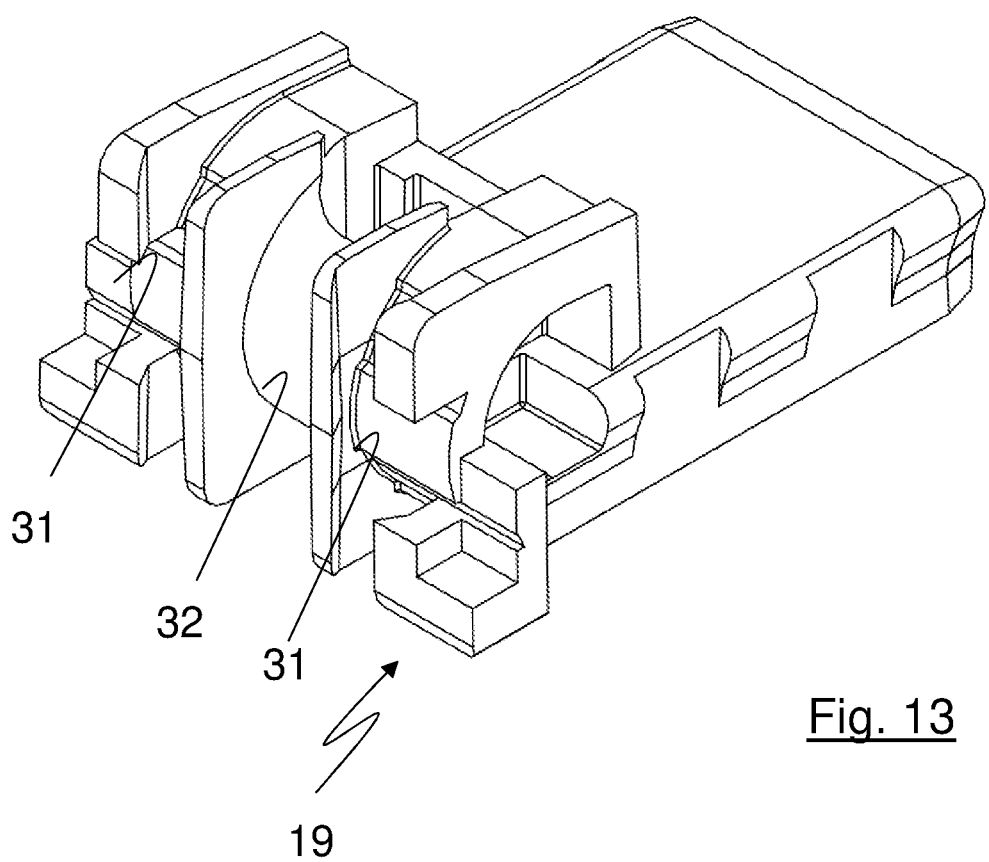
FIG. 13 is an isometric view of the deflection element of the linear guide system from FIGS. 6 to 12.

FIG. 13 shows the deflection element 19 of the third rail element 3. It serves to deflect the two traction members 29 and also to deflect the flat ribbon cable 14. For this purpose, the deflection element 19 comprises two first deflection surfaces 31, which serve to deflect the traction members 29. These deflection surfaces 31 are designed so that a sliding friction of the traction members 29 compared to the deflection surfaces 31 is minimised to the greatest extent possible. For this purpose, the deflection surfaces 31 are convexly curved and are circumferentially interrupted so that the support surface area is reduced. A second deflection surface 32 is provided between the two first deflection surfaces 31, which serves to deflect the flat ribbon cable 14. In the context of the present application, the deflection surfaces 31, 32 are sliding surfaces, because the traction members 29 as well as the flat ribbon cable 14 perform a sliding movement in relation to the deflection surfaces 31, 32 upon a relative movement of the rail elements 1, 2, 3 in relation to one another. However, the deflection surfaces 31, 32 could also be designed as surfaces of one or more rollers that are pivotable in relation to the deflection element 19.

In the illustrated embodiment, the traction members 29 cause a destressing of the flat ribbon cable 14, because the traction members 29 cause the movements of the rail elements 1, 2, 3 to be synchronised in relation to one another, so that the guidance of the flat ribbon cable 14 can occur largely without force. In an alternative embodiment, however, it may instead be advisable to also cause the synchronisation through the flat ribbon cable 14. The additional traction members 29 can then be omitted.

For the purpose of the original disclosure, it should be noted that all of the features as they become apparent to a person skilled in the art from the present description, the drawings, and the claims, even if they have been specifically described only in connection with specific other features, can be combined both individually and in any combination with other features or groups of features disclosed here, insofar as this has not been expressly excluded or technical circumstances make such combinations impossible or pointless. A comprehensive, explicit presentation of all conceivable combinations of features is omitted herein solely for the sake of the brevity and legibility of the description.

Although the invention has been presented and described in detail in the drawings and the foregoing description, this representation and description is merely an example and is not intended to limit the scope of protection as defined by the claims. The invention is not limited to the disclosed embodiments.

Modifications of the disclosed embodiments will be obvious to those skilled in the art based on the drawings, the description, and the appended claims. In the claims, the word "comprise" does not exclude other elements or steps, and the indefinite article "a" or "one" does not exclude a plurality. The mere fact that certain features are claimed in different claims does not preclude their combination. The reference signs in the claims are not intended to limit the scope of protection.

LIST OF REFERENCE SIGNS

1 First rail element
2 Second rail element
3 Third rail element
4 Linear guide
5 Ball cage
6 Extraction rail
7 Rail back
8 Extraction direction
9 Balls
10 Running surfaces of the first rail element
11 Running surfaces of the second rail element
12 Rail back
13 Electrical conductors
14 Cable
15 Plug
16 Point of deflection
17 First point of fixation
18 Second point of fixation
19 Deflection element
20 Sliding surface
21 Tab
22 Base body
23 First pair of running surfaces
24 Ball cage
25 Second pair of running surfaces
26 Electric motor
27 Threaded spindle
28 First assembly plate
29 Traction member
30 Tab
31 Deflection surface
32 Deflection surface
33 Second assembly plate

The invention claimed is:

1. A linear guide system, comprising:
a first rail element,
a second rail element, and
a third element,
wherein the first rail element and the second rail element are borne such that the first rail element and the second rail element are linearly displaceable in relation to one another in and counter to an extraction direction,
wherein the third element and the first rail element as well as the third element and the second rail element are borne together such that the third element and the first rail element as well as the third element and the second rail element are linearly displaceable in relation to one another in and counter to the extraction direction,
wherein the linear guide system comprises an electrical conductor,
wherein the electrical conductor is fixed on the first rail element at a first point of fixation and on the second rail element at a first point of fixation,
wherein the electrical conductor is electrically insulated against at least the third element, and
wherein the electrical conductor is deflected at a point of deflection on the third element.

2. The linear guide system according to the claim 1, wherein the electrical conductor is deflected at the point of deflection such that, regardless of an extraction position of the first rail element in relation on the second rail element, a total travel length of the electrical conductor, which is formed as a sum of a first partial travel length between the first point of fixation and the point of deflection and a second partial travel length between the first point of fixation and the point of deflection, is substantially constant.

3. The linear guide system according to claim 2, wherein the third element is a rolling body cage arranged between the first rail element and the second rail element,
wherein a plurality of rolling bodies are received on the rolling body cage, and
wherein each of the plurality of rolling bodies is rolled on a running surface of the first rail element and on a running surface of the second rail element.

4. The linear guide system according to claim 2, wherein the linear guide system is an extraction rail and the third element is a third rail element.

5. The linear guide system according to claim 2, wherein, at the point of deflection, the third element comprises a deflection element, wherein the electrical conductor is in contact with the deflection element and is deflected by the deflection element, and
wherein the deflection element is selected from a group consisting of a convexly curved sliding surface, a plurality of sliding surface portions having at least one recess between two sliding surface portions, and a pivotable deflection roller, or a combination thereof.

6. The linear guide system according to claim 1,
wherein the third element is a rolling body cage arranged between the first rail element and the second rail element,
wherein a plurality of rolling bodies are received on the rolling body cage, and
wherein each of the plurality of rolling bodies is rolled on a running surface of the first rail element and on a running surface of the second rail element.

7. The linear guide system according to claim 6, wherein, at the point of deflection, the third element comprises a deflection element,
wherein the electrical conductor is in contact with the deflection element and is deflected by the deflection element, and
wherein the deflection element is selected from a group consisting of the a convexly curved sliding surface, a plurality of sliding surface portions having at least one recess between two sliding surface portions, and a pivotable deflection roller, or a combination thereof.

8. The linear guide system according to claim 1,
wherein the linear guide system is an extraction rail and the third element is a third rail element.

9. The linear guide system according to claim 8, wherein, at the point of deflection, the third element comprises a deflection element, wherein the electrical conductor is in contact with the deflection element and is deflected by the deflection element, and wherein the deflection element is selected from a group consisting of a convexly curved sliding surface, a plurality of sliding surface portions having at least one recess between two sliding surface portions, and a pivotable deflection roller, or a combination thereof.

10. The linear guide system according to claim 1,
wherein, at the point of deflection, the third element comprises a deflection element,
wherein the electrical conductor is in contact with the deflection element and is deflected by the deflection element, and
wherein the deflection element is selected from a group consisting of a convexly curved sliding surface, a plurality of sliding surface portions having at least one recess between two sliding surface portions, and a pivotable deflection roller, or a combination thereof.

11. The linear guide system according to claim 1,
wherein, at the point of deflection, the third element comprises a deflection element,
wherein the electrical conductor is in contact with the deflection element and is deflected by the deflection element, and
wherein the deflection element is configured to be positioned, in relation to a base body of the third element, in one of a range of positions including at least a first tensioning position and a second tensioning position in the extraction direction.

12. The linear guide system according to claim 11,
wherein the deflection element is resiliently biased in or counter to the extraction direction so that the deflection element tensions the electrical conductor.

13. The linear guide system according to claim 1,
wherein a cable tensioner is provided on the third element,
wherein the cable tensioner is designed and arranged so as to tension the electrical conductor in a direction perpendicular to the extraction direction.

14. The linear guide system according to claim 1,
wherein the electrical conductor is electrically insulated against the first rail element and the second rail element.

15. The linear guide system according to claim 1,
wherein the electrical conductor is a component of a cable.

16. The linear guide system according to claim 1,
wherein the linear guide system comprises an electrical connection element,
wherein a first end of the electrical conductor is manufactured with the connection element.

17. The linear guide system according to claim 16,
wherein the connection element is designed to fix the electrical conductor on the first rail element or the second rail element.

18. The linear guide system according to claim 1,
wherein the linear guide system is an extraction rail,
wherein the third element is a third rail element,
wherein, at the point of deflection, the third rail element comprises a deflection element,
wherein the electrical conductor is in contact with the deflection element and is deflected by the deflection element,
wherein the extraction rail comprises a traction member,
wherein the traction member is fixed on the first rail element and on the third rail element, and
wherein the traction member is guided on the deflection element in a direction parallel to the extraction direction such that a displacement movement of the third rail element in relation to the first rail element leads to a displacement movement of the second rail element in relation to the third rail element.

19. The linear guide system according to claim 18,
wherein the deflection element comprises a first deflection surface and a second deflection surface,
wherein the first deflection surface is in contact with and deflects the traction member and the second deflection surface is in contact with and deflects the electrical conductor.

20. The linear guide system according to claim 18,
wherein the electrical conductor forms the traction member or the electrical conductor is integrated into the traction member.

* * * * *